United States Patent [19]

Jennings, III et al.

[11] Patent Number: 5,357,152
[45] Date of Patent: Oct. 18, 1994

[54] LOGIC SYSTEM OF LOGIC NETWORKS WITH PROGRAMMABLE SELECTED FUNCTIONS AND PROGRAMMABLE OPERATIONAL CONTROLS

[75] Inventors: Earle W. Jennings, III, Richardson, Tex.; George H. Landers, Mountain View, Calif.

[73] Assignee: Infinite Technology Corporation, Richardson, Tex.

[21] Appl. No.: 974,237

[22] Filed: Nov. 10, 1992

[51] Int. Cl.$^5$ ............... H03K 19/173; H03K 19/086
[52] U.S. Cl. ........................... 307/465; 364/764
[58] Field of Search .................. 307/465, 465.1; 364/764

[56] References Cited

U.S. PATENT DOCUMENTS

| Re. 34,363 | 8/1993 | Freeman | 307/465.1 |
| 4,872,137 | 10/1989 | Jennings, III | 364/400 |
| 4,935,737 | 6/1990 | Izbicki et al. | 307/465 |
| 4,982,114 | 1/1991 | Nakamura et al. | 307/465 |
| 5,233,241 | 8/1993 | Nishimori | 307/465 |
| 5,243,238 | 9/1993 | Kean | 307/465.1 |

OTHER PUBLICATIONS

Carver Mead, et al, Section 5.5 "The Arithmetic Logic Unit," *Introduction To VLSI Systems*, 1980, pp. 150–154.
Roy A. Wood, "A High Density Programmable Logic Array Chip," *IEEE Transactions on Computers*, vol. C–28, No. 9, Sep. 1979, pp. 602–608.
Steve Landry, "Application-specific ICs, relying on RAM, implement almost any logic function", *Electronic Design*, Oct. 31, 1985, pp. 123–130.
"Fitting Programmable Logic", IEEE Spectrum, Mar. 92, Clark.

*Primary Examiner*—Edward P. Westin
*Assistant Examiner*—Richard Roseen
*Attorney, Agent, or Firm*—Sharp, Comfort & Merrett

[57] ABSTRACT

A logic system comprising one or more logic networks that can perform a variety of preconfigured or preconfigurable logic functions. Each logic network is functionally separate from but operatively associated with one or more programmable circuits from which the logic network receives various logic signals. A first logic signal selects or preconfigures the desired logic function to be performed by the or each logic network while a second logic signal controls the operation of the selected logical function. The first logic signal can select a particular logic function to be performed by the logic network based on the contents of programmable cells in the network that are separate from the programmable circuits that supply the logic signals. Alternatively, the first logic signals can switch between various sub-networks each dedicated to performance of a preconfigured logic function. In this manner, the programmable circuit can essentially be dedicated to selecting which of various predetermined logic functions is to be utilized and is relieved of significant functional overhead associated with data manipulation. This can permit a smaller size programmable logic, gate or memory array to be used to control a logic operation of a given complexity, or a given size of array to control more complex operations. Both the programmable circuit(s) and the logic network(s) can be integrated in a single semiconductor chip.

17 Claims, 4 Drawing Sheets

LOGIC SYSTEM OF LOGIC NETWORKS WITH PROGRAMMABLE SELECTED FUNCTIONS AND PROGRAMMABLE OPERATIONAL CONTROLS

BACKGROUND OF THE INVENTION

This invention relates to logic systems incorporating programmable circuits.

Programmable Logic Devices (PLD) are well known and are widely used to perform a variety of logic functions which may be controlled by logic input signals to the device. Examples of PLDs include Programmable Logic Arrays (PLA), Programmable Gate Arrays (PGA), and Programmable Memory Arrays (PMA). A PLA is based on a combinatorial logic network implementing either a sum of products or a product of sums decomposition of logic functions. In either instance, a relatively large number of inputs are shared uniformly by the products (sums) making up a logical sum (product). PLAs may be factory or field programmable. One version of a PGA (so-called fine grain) is based on one or more combinatorial logic networks implementing any function of a small number (often less than 5) of logic inputs. Another PGA version (so-called coarse grain) can generate a limited number of (but not all) functions of a greater number of logic inputs. The functions generated usually have a limited number of product terms that can be summed. Both types of PGA use one or more memory cells for temporarily storing results. PGAs may be field or factory programmable. A PMA is based on building blocks requiring $2^n$ bits of memory for n logic inputs for implementing any logical function of the n inputs.

A disadvantage of these classes of PLDs is that a significant proportion of the applications require functions such as counting, addition, Boolean polynomials, etc. to be carried out. These functions require enough PLD resources to severely limit the amount of PLD resources available for controlling these operations.

SUMMARY OF INVENTION

The present invention contemplates the use of one or more logic networks that can perform a variety of logic functions, either by configuration of a multi-function network or by a switched network comprising several sub-networks each of which performs one or more dedicated logic functions. Each such logic network is functionally separate from but operatively associated with one or more programmable circuits from which that logic network receives logic signals to select a particular logic function or functions to be performed by the logic network. The programmable circuit also supplies logic signals to control the performance of the logic network in implementing the selected logic function. For example, the programmable circuit may provide logic signal(s) that select a counter function to be performed by a logic network as well as logic signal(s) that initiate, progress, and terminate the count operation.

In this manner the programmable circuit can essentially be dedicated to selecting the function and controlling the operations of the logic network(s) and is relieved of significant functional overhead associated with data manipulation now performed by the logic network(s). This can permit a smaller size programmable logic, gate or memory array to be used to control a logic operation of a given complexity, or a given size of array to control more complex operations. Integration in a semiconductor chip of programmable circuits and associated logic networks as contemplated by the invention, increases the overall efficiency and often increases the performance that can be achieved in terms of the complexity of applications which can be implemented in a given semiconductor chip area.

In some circumstances, additional off loading from the programmable circuit may be achieved by integrating groups of memory cells within the logic networks. The memory cells can be selectively activated by control signals from the programmable circuit to control one or more aspects of the operations being performed by the logic networks. Thus, the programmable circuit need only select the appropriate memory cell or cells, rather than generate all the control signals stored by those cells. Similarly, programmable logic or gate array control structures can embedded within the logic networks.

The logic network or networks may be dedicated or configured to perform specific data manipulation tasks which often can be carried out more efficiently than using programmable circuitry. Also, multiple data manipulation circuits can be concurrently controlled by the programmable circuit(s) with a minimal demand on resources of the programmable circuit(s), thereby enhancing overall circuit performance.

The functions provided by one or more of the logic networks can be changed by the logic signals from the programmable circuit as and when required by the overall logic function being implemented. Thus, more cost effective use can be made of both the programmable circuit and of the logic networks whose functionality and operations are controlled by the programmable circuit.

DETAILED DESCRIPTION OF EMBODIMENTS

Figure 1:
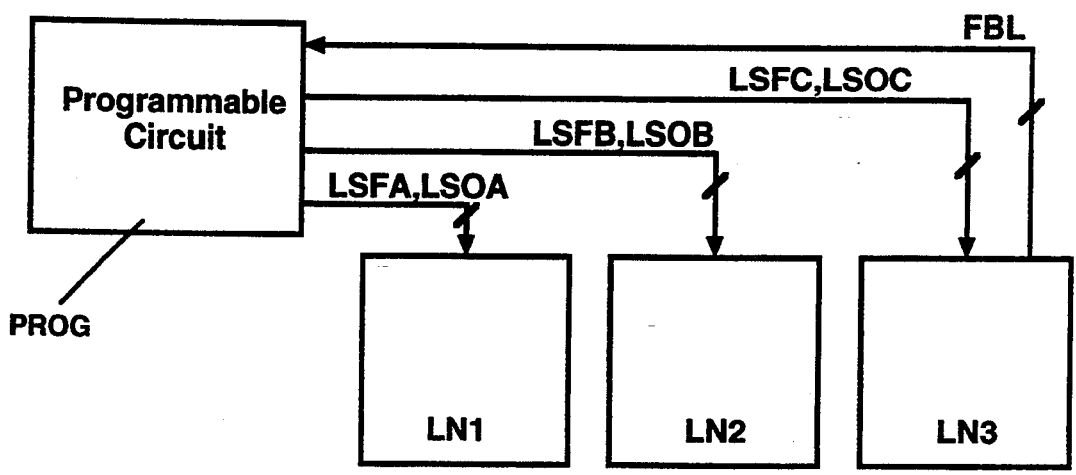
FIGS. 1, 2, 3 and 4 show block diagrams of variable function logic systems embodying the invention.

FIG. 1 shows a programmable circuit capable of generating at least first and second logic output signal sets LSFA,LSOA; LSFB,LSOB; and LSFC,LSOC derived from input signals to the programmable circuit. For example, the programmable circuit may comprise a programmable logic circuit such as a PLA, PGA or PMA as referenced above, or, advantageously, a user programmable logic device as disclosed in copending patent application Ser. No. 972,993 filed Nov. 10, 1992 for PROGRAMMABLE LOGIC DEVICE and assigned to the assignee of the present application.

The logic output signal sets LSFA,LSOA; LSFB,LSOB; and LSFC,LSOC are connected to be received by respective logic networks LN1; LN2; and LN3. In a basic embodiment of the invention, only one logic network might be provided whereas more complex systems may be implemented using more than one logic network. The logic signals LSFA, LSFB, and LSFC received by the logic networks determine which of plurality of logic functions that network is to perform while that logic signal LSF is applied or until a different logic signal LSF is applied. Following selection of a desired logic function to be performed by a logic network receiving a logic signal LSF, receipt of a logic signal LSO controls operation of that logic network to perform the desired function.

For example, the logic signal LSFA could select counter and comparator functions to be performed by the logic network LN1 with the logic signals LSOA controlling operation of the counter, control the provision whether the counter increments or decrements and control output of the count value to the comparator. If desired, one or more of the logic networks can have feedback connection(s) FBL to the programmable circuit, as shown for the logic network LN3. In the counter example just described, the feedback signal from the logic network LN3 could be an output from the counter indicating when the count has reached a desired value, e.g. zero. The feedback signal could be used as an input signal by the programmable circuit to generate logic signals to stop operation of the network LN1 as a counter and initiate generation of another logic signal LSFA to cause the logic network LN1 to provide a different logic function, e.g. to function as an adder, with operation of the adder controlled by the logic signals.

Figure 2:
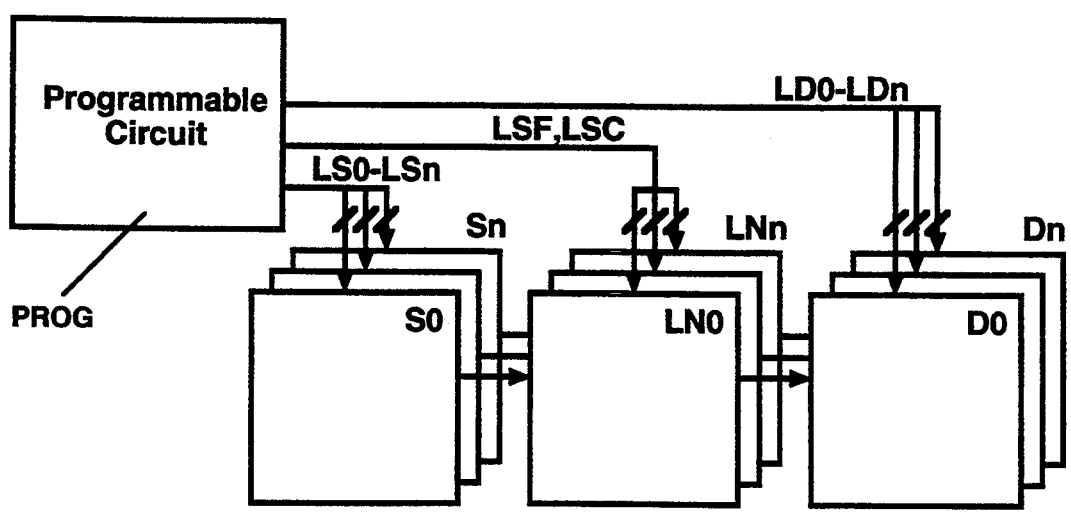

FIG. 2 shows an alternative implementation of the invention in which individual logic signal sources S0 . . . Sn are connected to provide respective sets of logic input signals to logic networks LN0 . . . LNn and logic output signals from the networks are connected to individual signal destinations D0 . . . Dn. The logic networks LN0, . . . are shown as receiving the same function and control signals LSF, LSC from the Programmable Circuit. The signal sources S0, . . . and signal destinations D0, . . . are connected to receive individual logic control signals LS0, . . . LSn and LD0, . . . LDn from the programmable circuit for each signal source and signal destination. If each logic network is functionally similar, then a programmable control system implementing a Single Instruction Multiple Datapath (SIMD) data processor can be implemented.

Significant performance improvements can be achieved in many digital signal processing applications if multiple data signal processing units can be assigned the same function to be performed on different data. For example, there is a large number of independent additions inherent in matrix addition and having these operations performed concurrently represents an inherent performance advantage.

Consider the addition of two 4 by 4 matrices and storage of the results in a third matrix using a logic system embodying the present invention. The data of the two matrices to be added could be stored in two 4×4 memory circuits (SA and SB) which would constitute first and second signal sources S0 and S1 in an arrangement as depicted in FIG. 2. A third 4×4 number memory circuit (DC) would constitute a data destination D0 in FIG. 2. Four logic networks LN0 . . . LN3, each comprising a general purpose ALU would be used. The programmable circuit would be provided with input logic signals to generate function selection signals LSF for enabling or configuring the ALUs in the logic networks LN0 . . . LN3 to perform add functions. Source control signals LS0, LS1 from the programmable circuit would transfer data from the memory circuits comprising the signal sources S0 and S2 as inputs to the ALUs of the logic networks LN0 . . . LN3 to be operated on under control of control signals LSC from the programmable circuit. The control signals LD0 would control transfer of data from the ALUs in the logic networks LN0 . . . LN3 to the 4×4 number memory circuit of the signal destination D0. The logic signals LS0,1 generated by the programmable circuit would control implementation of data transfers between the signal sources SA0, S01 and the ALUs of the logic networks LN0 . . . LN3, and the logic signals LD0 would control data transfers from the data destination D0. The logic signals LS0 . . . 3 control the four ALUs to implement the following logic operations:

CYCLE 1:

$DA[0,0] = SA[0,0] + SB[0,0]$
$DA[0,1] = SA[0,1] + SB[0,1]$
$DA[0,2] = SA[0,2] + SB[0,2]$
$DA[0,3] = SA[0,3] + SB[0,3]$

CYCLE 2:

$DA[1,0] = SA[1,0] + SB[1,0]$
$DA[1,1] = SA[1,1] + SB[1,1]$
$DA[1,2] = SA[1,2] + SB[1,2]$
$DA[1,3] = SA[1,3] + SB[1,3]$

CYCLE 3:

$DA[2,0] = SA[2,0] + SB[2,0]$
$DA[2,1] = SA[2,1] + SB[2,1]$
$DA[2,2] = SA[2,2] + SB[2,2]$
$DA[2,3] = SA[2,3] + SB[2,3]$

CYCLE 4:

$DA[3,0] = SA[3,0] + SB[3,0]$
$DA[3,1] = SA[3,1] + SB[3,1]$
$DA[3,2] = SA[3,2] + SB[3,2]$
$DA[3,3] = SA[3,3] + SB[3,3]$ where $SA[x,y]$, $SB[x,y]$ and $DC[x,y]$ represent the data stored at a memory location x,y of the indicated memory corresponding to the data at the corresponding matrix location.

Thus, the above described embodiment of the invention permits the addition of two 4×4 matrices and storing the results in a third matrix to be performed in 4 operation cycles rather than 16 cycles required using a single arithmetic processor.

Design of the programmable circuit to generate the logic signals required to control the ALUs in conjunction with the data transfers from source and destination memories to carry out the above series of logic operations can be implemented using techniques available in the art.

Figure 3:
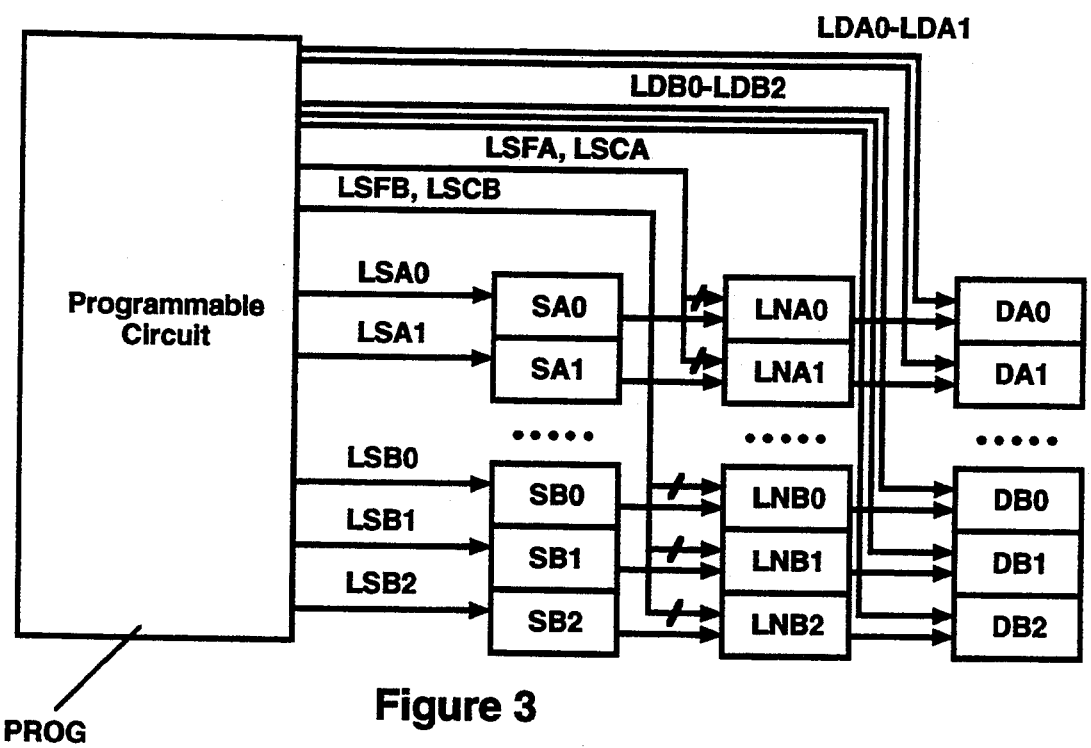

FIG. 3 shows a logic system embodying the invention in which a programmable circuit controls the function and operation of logic networks arranged in clusters. Thus, one cluster may comprise two logic networks LNA0,LNA1, LN1B together with associated signal sources SA0,SA1 and signal destinations DA0,DA1 while another cluster may comprise three logic networks LNB0 . . . LNB2 with associated signal sources and signal destinations SA0,SA1; DA0,DA1 and SB0 . . . SB2; DB0 . . . DB2. The programmable circuit provides logic function selection signals LSFA and LSFB to the logic network clusters LNA0,LNA1 and LNB0 . . . LNB2 respectively as well as respective control signals LSCA and LSCB. In addition, the programmable circuit supplies individual control signals LSA0,LSA1 and LSB0 . . . LSB2 to the signal sources SA0,SA1 and SB0 . . . SB2, respectively, as well as individual control signals LDA0,LDA1 and LDB0 . . . LDB2 to the signal destinations DA0,DA1 and DB0 . . . DB2, respectively.

There could be more than two clusters of logic networks in a particular system and the number of clusters, as well as the number and the control of logic networks, signal sources and signal destinations in a particular cluster as a group or individually, may vary dependent on the particular functionality of the system being implemented.

An arrangement such as exemplified by FIG. 3, allows for partitioning of logic function implementation tasks into clusters of concurrent activities which can be tuned for optimal performance by means of the Programmable Circuit. When the logic networks are similar in each cluster, such circuitry can implement a Partitioned Single Instruction Multiple Datapath (PSIMD) processor. This form of system arrangement has application in the performance of various signal processing tasks, for example, matrix manipulation, neural network operations, Fast Fourier Transforms (FFT), etc. It permits a large number of operations (e.g. multiplications) to be carried out in parallel by one or more stages (clusters) while other operations (e.g. additions) are performed in another cluster(s) potentially upon the results of the first operations. For example, the ability to have clusters of logic networks perform multiplication functions while other clusters perform add functions enables the throughput of such a system to be pipelined in an optimal manner. The programmable circuitry can readily be programmed to control the logic networks to perform exactly the functions required for that particular application.

By configuring each cluster to include a single logic network LN, the circuit as described with reference to FIG. 3 can implement a Multiple Input, Multiple Datapath data processor (MIMD).

Consider an application requiring the matrix multiplication of two 4×4 matrices (A and B) and storing the results in a third 4×4 matrix (C). The computations to be performed are:

C[0,0]=A[0,0]*B[0,0]+A[0,1]*B[1,0]+A[0,2]*B[2,0 ++A[0,3]*B[3,0]
C[1,0]=A[1,0]*B[0,0]+A[1,1]*B[1,0]+A[1,2]*B[2,0]+A[1,3]*B[3,0]
C[2,0]=A[2,0]*B[0,0]+A[2,1]*B[1,0]+A[2,2]*B[2,0]+A[2,3]*B[3,0]
C[3,0]=A[3,0]*B[0,0]+A[3,1]*B[1,0]+A[3,2]*B[2,0]+A[3,3]*B[3,0]

Similar computations follow to derive C[0,1], ... ; C[0,2], ... ; and C[0,3], ... , and the overall set of computations may be summarized as:

C[i,j]=A[i,0]*B[0,j]+A[i,1]*B[1,j]+A[i,2]*B[2,j]+A[i,3]*B[3,j]
for i=0,1,2,3 and for j=0,1,2,3.

It will be seen that 16 numerical results are generated, each requiring 4 multiplication and 3 addition operations. If it is assumed that a multiplication operation and an addition operation take the same amount of time to perform, then the time required to perform the overall set of operations by a single arithmetic processor would be 16*7=112 operation cycles.

Figure 4:
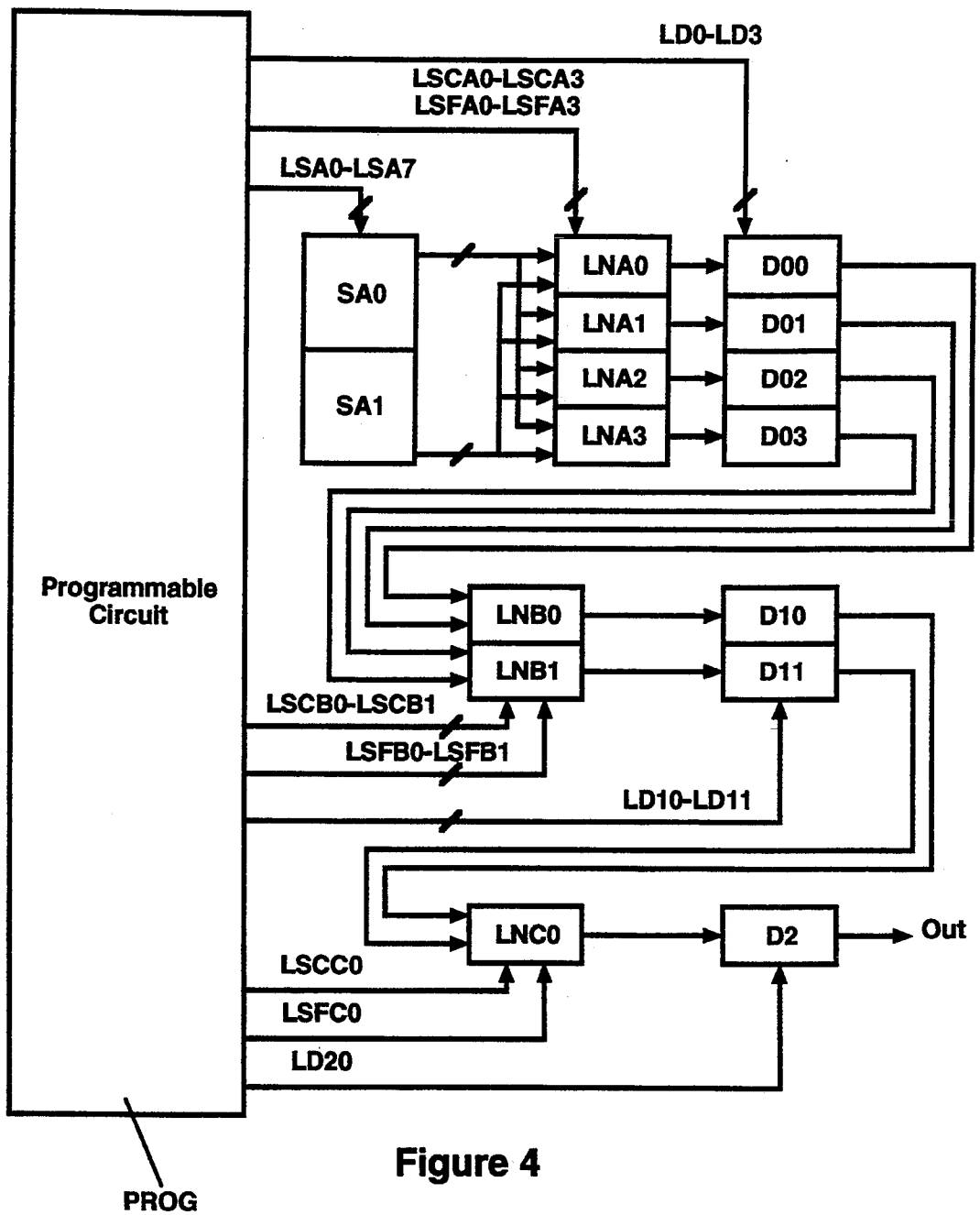

An embodiment of the invention can be structured to provide a significant reduction in the number of operation cycles required to perform this set of operations and is depicted in FIG. 4. The system includes three clusters of logic networks, the first comprising four networks LNA0...LNA3; the second comprising two networks LNB0,LNB1; and the third comprising a single network LNC0. Each of these logic networks comprises a general purpose arithmetic unit (ALU).

Two signal sources, each comprising a 4×4 memory circuit for storing data corresponding to matrix A and matrix B, respectively, are connected to provide data signal inputs to the first set of logic network ALUs LNA0...LNA3. Data output from the ALUs of the networks LNA0...LNA3 are connected to data destinations D00...D03 which in turn are connected to data inputs of the ALUs of the second cluster of logic networks LNB0,LNB1. Data output from the ALUs of the logic networks LNB0,LNB1 are connected for storage in two data destinations D10,D11 each comprising a 4×4 memory circuit, outputs from which are connected as data inputs to the ALU of the logic network LNC0. Data outputs from the ALU of logic network LNC0 are stored in a data destination D2 comprising a 4×4 memory circuit and provide the overall results of the matrix multiplication operation represented by C[i,j] for i=0,1,2,3 and j=0,1,2,3, as explained above. The operations required to be performed by the system depicted in FIG. 4 to generate the numerical array C[i,j] can be expressed as:

D00=A[i,0]*B[0,j]
D01=A[i,1]*B[1,j]
D02=A[i,2]*B[2,j]
D03=A[i,3]*B[3,j]
D10=D00+D01
D11=D02+D03
C[i,j]=D2=D10+D11

The programmable circuit provides logic signals LSFA0...3 to the logic networks LNA0...LNA3 enabling the ALUs in those networks to implement multiplication functionality; and the ALUs of the logic networks LNB0,LNB1 and LNC0 receive logic signals LSFB0,1; LSCB0,1 and LSFC0,lSCC0, respectively to enable those ALUs to implement add operations.

In an initial cycle of operation of this system, the programmable circuit supplies logic signals LSA0...7 to the signal sources SA0 and SA1 to transfer pairs of signals as inputs to the ALUs of the logic networks LNA0...LNA3 which are controlled by the signals of the signal sets LSCA0...3 and LSFA0...3 to generate the logic signals D00,D01,D02 and D03 representing the individual A*B terms to be added in the C[0,0] term shown above, and the logic signals representing D00...D03 are transferred by signals in the set LSD0 to appropriate locations in the memory circuits of the signal destinations D00...D03.

During the second operating cycle, these data from the memory circuits D00...D03 provide inputs to the ALUs of the logic network LNB which are controlled by signals of the sets LSCB0,1 and LSFB0,1 to perform the add functions that generate the logic signals D10 and D11. Also, during the second cycle, the data outputs from the ALUs of the logic networks LNB0,LNB1 are transferred to appropriate memory locations in the memory circuits of the signal destinations D10 and D11. Concurrently during the second cycle of operations, the ALUs of the logic networks LNA0...LNA3 are processing a second set of [A,B] inputs from SA0,SA1 to generate signals D00, D01, D02, D03 representing individual A*B terms of the C[1,0] term shown above.

During a third operating cycle, the contents of the memory circuits of the signal destinations D10 and D11 provide data inputs to the ALU of the logic network LNC0 which functions under control of the signals LSCC0 and LSFC0 to perform the necessary add functions to generate the D11 term shown above and to transfer the resultant ALU output to the memory circuit of the signal destination D2 where it is stored at an appropriate memory location under the control of logic signal(s) LD20. Concurrently, during this third operating cycle, the ALUs of the logic networks LNA0 . . . 3 and LNB0,1 are functioning as described above to generate and transfer outputs required for generation of subsequent [C1,0] and C[2,0] terms necessary to complete the matrix multiplication operations.

These cycles of operation continue in this manner and it will thus be apparent that in a particular operating cycle, the logic network cluster LNC0 is processing the results of the operation of the logic network cluster LNB0,1 generated during the previous cycle and that the logic networks of the second cluster are processing the results of the operation of the logic networks LCNA0 . . . LCNA3 during the preceding cycle of operations. Consequently, the matrix multiplication operation described with reference to FIG. 4 can be carried out over 16+3=19 operating cycles instead of the 112 operating cycles required using a single arithmetic unit to perform the multiplication and add operations in sequence. While the system described with reference to FIG. 4 uses 7 arithmetic units, in many applications the operational speed enhancement represents a significant advantage. Also, as previously mentioned, restriction of the programmable circuit to provision of the necessary function selection and control signals and offloading the data manipulation tasks to logic networks functionally separate from the programmable circuit, enhances the overall system performance. The standard method for evaluating the efficiency of a network of n processing elements is the ratio of how closely the performance of that network approaches n times the performance of a network having one such processor.

Note that in the previous examples of embodiments of the invention, the LSF signal(s) could select addition, subtraction, or multiplication, and the LSC signals could select the data types of the arithmetic, e.g. 16 bit integer, 32 bit integer, single precision floating point or double precision floating point.

Design of the programmable circuit to generate the logic signals required to control the ALUs in conjunction with the data transfers from source and destination memories to carry out the above series of logic operations can be implemented using techniques available in the art.

Figure 5:
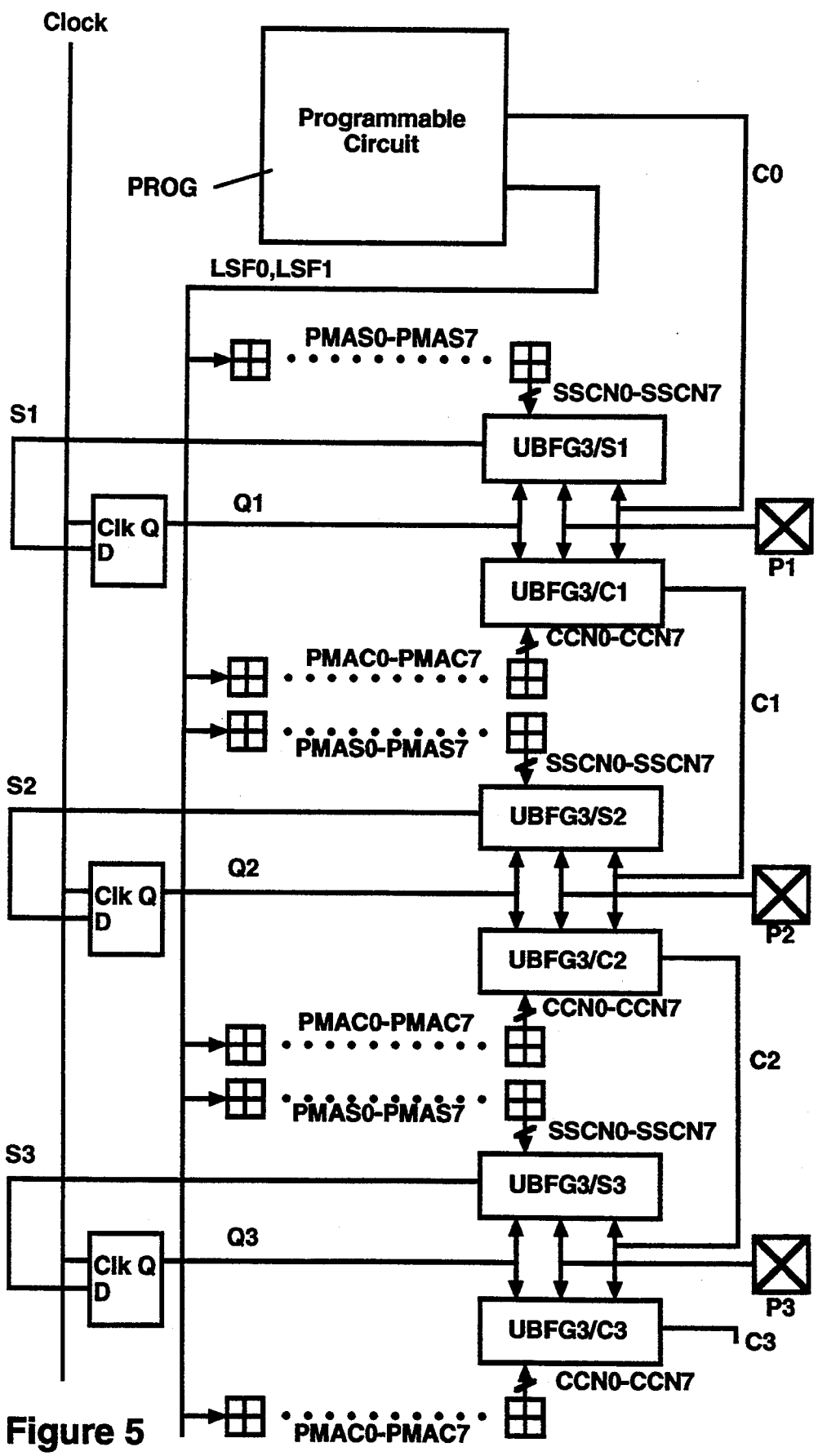
FIG. 5 is a more detailed block diagram of an embodiment of the invention in which a variable function logic network is controlled by logic signals from a programmable circuit.

FIG. 5 shows a more detailed example of a logic network and how it may be configured and enabled by logic signals from a programmable circuit, to perform any of a variety of arithmetic operations. As previously stated the programmable circuit could be any form of PLD but advantageously is a triangular folded programmable logic device as described the above indentified in copending U.S. patent application Ser. No. 972,993.

The logic network comprises three stages (although more or less could be used as required), each stage including a D flip flop, two Universal Boolean Function Generators (UBFG) UBFG3/Si and UBFG3/Ci, an external logic signal port Pi, and two groups of eight programmable memory cell sets PMAS0 . . . 7 and PMAC0 . . .7, with four memory cells in each set. The external ports Pi may be terminal pins on an IC chip on which the programmable circuit and the logic network are integrated. The memory cells PMAS0 . . . 7 and PMAC0 . . . 7 can advantageously be integrated into the semiconductor chip at locations convenient to the UBFGs with which they are associated.

Each of the UBFGs comprises eight AND function logic gates connected to receive first inputs which are the eight respective minterms of three logic input signals to the UBFG. The AND function gates also are connected to receive second or control logic inputs from associated programmable memory cells. The outputs from the AND function gates provide inputs to an output OR function logic gate for the UBFG. The AND function gates thus selectively connect data stored by the memory cells to the output OR logic function gate, as a function of the logic signal input to the UBFG derived from the three input logic signals. An example of a two input universal function generator is described in INTRODUCTION TO VLSI SYSTEMS, Carver Mead and Lynn Conway, pages 152–153 with reference to FIGS. 5.5 and 5.6, Addison-Wesley Publishing Company, 1980 and incorporated herein by reference.

Thus, it will be seen that the first stage of the logic network comprises UBFG3/S1 and UBFG3/C1 each having three logic input signals comprising the Q output of the D flip flop of that stage, a logic signal input from the pin P1, and a logic input signal C0 supplied by the programmable logic circuit. UBFG3/S1 is connected to the memory cell group PMAS0 . . . 7 to receive its second input logic signals from selected cells in the respective memory cell sets of that group. UBFG3/C1 is connected to the memory cell group PMAC0 . . . 7 to receive its second input logic signals from selected cells in the respective memory cell sets of that group. The logic signal S1 output from the OR function logic gate of UBFG3/S1 is connected to the D input of the flip flop of the first stage whereas the logic signal output C1 from the UBFG3/C1 is connected as one of the set of three logic signal.

The second, third and any succeeding stages of the logic network are structured and interconnected in like manner.

Of the programmable logic circuit output signals C0, and LSF0,1, the signal CO represents a carry input for typical arithmetic operations, such as count, add, and subtract; it also can be used for shift operations. The signals SSCN0-7 each can be selected by signals in the signal set LSF0,1 from any of the signals stored in the corresponding 4-cell memory set of the group PMAS0 . . . 7. Likewise, the signals CCCN0-7 each can be selected by signals in the signal set LSF0,1 from any of the signals stored in the corresponding 4-cell memory set of the group PMAC0 . . . 7. By embedding the memory cells near to the control inputs of the UBFGs with which they are associated, the network of UBFGs could be configured by sharing the address signals of the memory cells associated with each of the UBFG3/S control inputs, then two programmably generated signals of the signal set LSF0,1 could be used to configure all of the UBFG3/S circuits to perform any of four distinct logic functions.

The logic signal C3 output from UBFG3/C3 can be fed back as a logic input signal to the programmable circuit to provide (i) a Carry Output signal for standard arithmetic operations such as count, add, subtract, etc.; (ii) Shift Output for shift operations; (iii) Zero Detect for Comparison operations.

Let the following formulae define the output signals of UBFG3/Si and UBFG3/Ci respectively:

$$Si = SCN0 \& Qi^* \& Pi^* \& Ci - 1^*$$

-continued
```
OR SCN1 & Qi* & Pi* & Ci − 1
OR SCN2 & Qi* & Pi & Ci − 1*
OR SCN3 & Qi* & Pi & Ci − 1
OR SCN4 & Qi & Pi* & Ci − 1*
OR SCN5 & Qi & Pi* & Ci − 1
OR SCN6 & Qi & Pi & Ci − 1*
OR SCN7 & Qi & Pi & Ci − 1
Ci = CCN0 & Qi* & Pi* & Ci − 1*
OR CCN1 & Qi* & Pi* & Ci − 1
OR CCN2 & Qi* & Pi & Ci − 1*
OR CCN3 & Qi* & Pi & Ci − 1
OR CCN4 & Qi & Pi* & Ci − 1*
OR CCN5 & Qi & Pi* & Ci − 1
OR CCN6 & Qi & Pi & Ci − 1*
OR CCN7 & Qi & Pi & Ci − 1
```

For the moment consider the SSCN0-7 and CCN0-7 signals as being shared.

The following functions of Qi, Pi and Ci-1 will implement an Incrementing function and operations where CO is assumed to be 1:

```
Si = Qi XOR Ci − 1
   = Qi & Ci − 1* OR Qi* & Ci − 1
   = Qi & Pi & Ci − 1* OR Qi & Pi* & Ci − 1*
     OR Qi* & Pi & Ci − 1 OR Qi* & Pi* & Ci − 1
Ci = Qi & Ci − 1
   = Qi & Pi & Ci − 1 OR Qi & Pi* & Ci − 1
for i = 1, 2, 3, . . .
```

The following functions of Qi, Pi and Ci-1 implement an addition function and operations with C0 as Carry input:

```
Si = Qi XOR Ci − 1 XOR Pi
   = Qi* & (Ci − 1 XOR Pi) OR Qi & (Ci − 1 XOR Pi)*
   = Qi* & Pi* & Ci − 1 OR Qi* & Pi & Ci − 1*
     OR Qi & Pi & Ci − 1 OR Qi & Pi* & Ci − 1*
Ci = Qi & Ci − 1 OR Qi & Pi OR Ci − 1 & Pi
   = Qi & Pi & Ci − 1 OR Qi & Pi* & Ci − 1
     OR Qi & Pi & Ci − 1*
     OR Qi* & Pi & Ci − 1
```

The following functions of Qi, Pi and Ci-1 implement subtraction function and operations. CO must now be 1 for 2's complement arithmetic.

```
Si = Qi XOR Ci − 1 XOR Pi*
   = Qi* & (Ci − 1 XOR Pi*) OR Qi & (Ci − 1 XOR Pi*)*
   = Qi* & Pi & Ci − 1 OR Qi* & Pi* & Ci − 1*
     OR Qi & Pi* & Ci − 1 OR Qi* & Pi & Ci − 1*
Ci = Qi & Ci − 1 OR Qi & Pi* OR Ci − 1 & Pi*
   = Qi & Pi & Ci − 1 OR Qi & Pi* & Ci − 1
     OR Qi & Pi* & Ci − 1*
     OR Qi* & Pi* & Ci − 1
for i = 1, 2, 3, . . .
```

The following functions i, Pi and Ci-1 implement shift right function and operations with CO as shift input:

```
Si = Ci − 1
Ci = Qi
for i = 1, 2, 3, . . .
```

The above arithmetic operation control signals can be readily coded into the SSCN0 to SSCN7 and CCN0 to CCN7 control values of 0 and 1.

As mentioned above, the locally situated memory cell groups PMAS0 . . . 7 and PMAC0 . . . 7 for the respective stages, permits each SSCN and CCN control signal to be uniquely generated and the logic configuration to be programmably determined so that different logic functions and operations can be performed by each of the UBFG3's.

For example, associate with each control signal SSCN0-7 and CCN0-7 of each UBFG3 four bits of memory PMAS0 . . . 7 and PMAC0 . . . 7 as described above:

In bit 0 encode the controls for incrementing the Q bit vector.

In bit 1 encode the controls for shifting right the Q bit vector.

In bit 2, encode the controls for addition of Q's to P's.

In bit 3, encode the controls for 2's complement subtraction of the Q bit vector from the P bit vector.

The above described embodiments are exemplary only and different and more complex configurations utilizing the principles described herein will be apparent to those skilled in the art.

What is claimed is:

1. A logic system comprising a programmable circuit to generate a plurality of output logic signals derived from logic signals input to said programmable circuit; and a logic network, separate from said programmable circuit, comprising a plurality of preconfigured or preconfigurable logic functions, connected to receive said plurality of logic signals from said programmable circuit; at least a first one of said plurality of logic signals selecting a particular one of said logic functions to be performed by said logic network; and at least a second one of said logic signals controlling the operation of the selected logic function by said logic network.

2. A logic system according to claim 1, wherein said programmable circuit is a programmable logic device.

3. A logic system according to claim 1, wherein said programmable circuit is a programmable memory.

4. A logic system according to claim 1, wherein said logic network is programmable to define said plurality of preconfigured logic functions.

5. A logic system according to claim 1, wherein said logic network is capable of performing at least count, add and shift functions.

6. A logic system according to claim 1, wherein at least a third one of said plurality of logic signals controls a source circuit to provide input logic signals to said logic network.

7. A logic system according to claim 1, wherein at least a fourth one of said plurality of logic signals controls output of logic signals from said logic network to an output signal destination.

8. A logic system according to claim 1, including a plurality of said logic networks each connected to receive said at least first one and said at least second one of said plurality of logic signals.

9. A logic system comprising a programmable circuit to generate a plurality of output logic signals derived from logic signals input to said programmable circuit; and a logic network, functionally separate from said programmable circuit, comprising a plurality of preconfigured or preconfigurable logic functions, connected to receive said plurality of logic signals from said programmable circuit; said plurality of logic signals operable to perform at least the functions of selecting the particular logic function to be performed by said logic network and controlling the operation of the selected logic function during performance by said logic network.

10. A logic system according to claim 1, wherein said logic network comprises a plurality of interconnected programmable logic function generators (PLFG), each PLFG including a set of logic inputs connected to receive a plurality of third logic signals, each PLFG including means for generating any logic function of that set of logic inputs according to control inputs applied to said PLFG; and for each control input, a group of programmable memory cells individually selectable to provide a desired stored control input; wherein said first logic signals are connected to said groups of memory cells of said plurality of PLFGs to select respective control inputs to program the logic functions performed by the respective PLFGs and thereby preconfigure said logic function performed by said logic network; and wherein said second logic signal is connected to at least one of said PLFGs to control operation of the logic function performed by said logic network.

11. A logic system according to claim 10, wherein said PLFGS are programmable to perform any of arithmetic, shift and comparator logic functions.

12. A logic system according to claim 1, including a plurality of said logic networks each connected to receive the same first and second logic signals from the programmable circuit; said plurality of logic networks connected to individual signal sources for receiving input signals, and connected to supply output logic signals to individual signal destinations; said plurality of logic signals from the programmable circuit also including a set of third logic signals and a set of fourth logic signals, logic signals in said third set connected individually to said signal sources to control transfer of input signals; said set of fourth logic signals connected individually to said signal destinations to control transfer of logic signals.

13. A logic system according to claim 12, wherein the or each said signal source comprises programmable memory.

14. A logic system according to claim 12, wherein said signal destinations comprise programmable memory.

15. A logic system according to claim 1, including a plurality of sets of said logic networks; the logic networks in each set connected to respective signal destinations, said plurality of logic signals from said programmable circuit including, for each respective set of logic networks, an individual set of said first logic signals and an individual set of said second logic signals, and a set of further logic signals connected to control transfer of output logic signals from the logic networks of that set to said respective signal destinations; said signal destinations of each of said sets of logic networks except a final set connected to transfer output logic signals received from a logic network set to provide input signals to logic networks of another one of said sets other than an initial set; said initial set of logic networks connected to at least one signal source, and an additional set of logic signals from said programmable logic circuit connected to control transfer of input signals from said at least one signal source as logic inputs to said initial set of logic networks.

16. A logic system comprising a programmable circuit to generate a plurality of sets of output logic signals derived from logic signals input to said programmable circuit; and a plurality of logic networks, separate from said programmable circuit, each said logic network comprising a plurality of preconfigured or preconfigurable logic functions, each said logic network connected to receive a set of said plurality of logic signals from said programmable circuit; at least a first one of said plurality of logic signals in each set selecting a particular one of said logic functions to be performed by said logic network; and at least a second one of said logic signals in each set controlling the operation of the selected logic function by a said logic network.

17. A logic system according to claim 16, wherein each said logic network comprises a plurality of interconnected programmable logic function generators (PLFG), each PLFG including a set of logic inputs connected to receive a plurality of third logic signals, each PLFG including means for generating any logic function of said plurality of third logic signals according to control inputs applied to said PLFG; and means controlled by said first one of said logic signals to select the control inputs applied to said PLFGs thereby to preconfigure the logic function performed by said logic network; and wherein said second one of said logic signals is connected to at least one of said PLFGs to control operation of the logic function performed by said logic network.

* * * * *